(12) United States Patent
 Takizawa

(10) Patent No.: US 8,120,157 B2
(45) Date of Patent: Feb. 21, 2012

(54) PRINTED WIRING BOARD STRUCTURE, ELECTRONIC COMPONENT MOUNTING METHOD AND ELECTRONIC APPARATUS

(75) Inventor: Minoru Takizawa, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/163,877

(22) Filed: Jun. 27, 2008

(65) Prior Publication Data

US 2009/0001538 A1    Jan. 1, 2009

(30) Foreign Application Priority Data

Jun. 29, 2007    (JP) ................. 2007-173364

(51) Int. Cl.
*H01L 23/02*    (2006.01)
(52) U.S. Cl. ............... 257/686; 257/E23.001; 257/778
(58) Field of Classification Search .................. 257/678, 257/685, 686, E23.001, 687, 688, 778, 779–781, 257/E23.023
See application file for complete search history.

(56) References Cited

U.S. PATENT DOCUMENTS

| | | | |
|---|---|---|---|
| 6,324,756 B1 * | 12/2001 | Li et al. ........................... | 29/841 |
| 2004/0195667 A1 * | 10/2004 | Karnezos ...................... | 257/686 |
| 2007/0035021 A1 * | 2/2007 | Suzuki et al. ................. | 257/737 |

FOREIGN PATENT DOCUMENTS

| | | |
|---|---|---|
| JP | 2002-271014 | 9/2002 |
| JP | 2004-273617 | 9/2004 |
| JP | 2004-273617 A | 9/2004 |
| JP | 2006-128441 | 5/2006 |
| JP | 2006-196874 | 7/2006 |
| JP | 2007-012645 | 1/2007 |

OTHER PUBLICATIONS

Notice of Reasons for Rejection mailed by Japan Patent Office on Dec. 8, 2009 in the corresponding Japanese patent application No. 2007-173364.
Decision of Rejection mailed by Japan Patent Office on May 18, 2010 in the corresponding Japanese patent application No. 2007-173364.

* cited by examiner

*Primary Examiner* — Hoa B Trinh
(74) *Attorney, Agent, or Firm* — Knobbe, Martens, Olson & Bear, LLP

(57) ABSTRACT

According to one embodiment, a printed wiring board structure comprises a printed wiring board having first and second component mounting surfaces at front and back sides thereof, respectively, each for mounting a semiconductor package loading a semiconductor chip loaded on a substrate as a mounting component, a first semiconductor package mounted on the first component mounting surface, and a second semiconductor package mounted on the second component mounting surface, wherein the first and second semiconductor packages have a positional relationship such that the substrates are partially overlapped via the printed wiring board, and the semiconductor chips are not overlapped.

4 Claims, 3 Drawing Sheets

PRINTED WIRING BOARD STRUCTURE, ELECTRONIC COMPONENT MOUNTING METHOD AND ELECTRONIC APPARATUS

CROSS-REFERENCE TO RELATED APPLICATIONS

This application is based upon and claims the benefit of priority from Japanese Patent Application No. 2007-173364, filed Jun. 29, 2007, the entire contents of which are incorporated herein by reference.

BACKGROUND

1. Field

One embodiment of the present invention relates to a printed wiring board structure in which a semiconductor package having a semiconductor chip loaded on a substrate is mounted on both surfaces of a printed wiring board.

2. Description of the Related Art

A circuit board mounted with a large-sized semiconductor package forming a CPU and its peripheral circuits is provided as a main component in a housing of an electronic apparatus such as a personal computer. The large-sized semiconductor package has some tens of millimeters square.

This kind of circuit board used for the electronic apparatus such as the personal computer requires means for protecting a mounting surface of the semiconductor package. Specifically, there is a need of protecting the mounting surface from warp and deformation of a substrate and from stress applied by impact and vibration given externally.

For example, the following method disclosed in Jpn. Pat. Appln. KOKAI Publication No. 2002-271014 has been known as means for protecting a solder joint part of a semiconductor component mounted on a substrate. According to the method of mounting electronic components, a semiconductor device is fixed to the substrate using an under-fill resin as a reinforcement means.

The reinforcement means using the foregoing under-fill resin is applied to the circuit board mounted with a large-sized semiconductor package having some tens of millimeters square. In this case, the following problem arises. Specifically, self-heating caused by a circuit operation of the semiconductor package occurs. For this reason, thermal expansion of the reinforcement material filled as the under-fill between the semiconductor package and the substrate is repeated every time the semiconductor package is operated. The foregoing thermal expansion applies excessive stress to the solder joint portion of the semiconductor package. In particular, a circuit board mounted with a large-sized semiconductor package such as BGA and LGA having the solder joint portion array on the package backside has the following problem. Namely, stress is concentrated on the corner portion of a rectangular package, and thereby, the circuit of the solder joint portion is broken down. This problem further remarkably appears when coefficient of thermal expansion of the reinforcement material filled as under-fill differs from those of the semiconductor package and the substrate. In addition, there is a problem that rework is difficult because the entire mounting surface of the large-sized semiconductor package is fixedly bonded to the substrate.

On the other hand, with multi-function and high function of electronic apparatus, a circuit board applied to the electronic apparatus requires higher mounting density of wirings and mounting components. In order to meet the foregoing requirements, the following various printed wiring board structures have been proposed. According to one conventional printed wiring board structure, semiconductor packages such as BGA and LGA, each loading a semiconductor chip on a substrate, are mounted in an overlap manner on both surfaces of a printed wiring board. This kind of printed wiring board structure has the following problem. An overlapping ratio of semiconductor packages mounted on both surfaces of the printed wiring board gives a negative influence to the connection reliability in the printed wiring board. If the overlapping ratio increases, large stress-strain is applied in accordance with the foregoing increase; as a result, connection reliability is reduced. In other words, when the foregoing overlapping ratio is reduced, improvement of the connection reliability is performed. However, reducing the overlapping ratio is a factor of reducing the mounting density of wirings and components. As a result, there is a problem that a circuit board is made into a large size.

According to one aspect of the present invention, there is provided a printed wiring board structure comprising:

a printed wiring board having first and second component mounting surfaces at front and back sides thereof, respectively, each for mounting a semiconductor package loading a semiconductor chip loaded on a substrate as a mounting component;

a first semiconductor package mounted on the first component mounting surface; and a second semiconductor package mounted on the second component mounting surface, wherein the first and second semiconductor packages have a positional relationship such that the substrates are partially overlapped via the printed wiring board, and the semiconductor chips are not overlapped.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Figure 1:
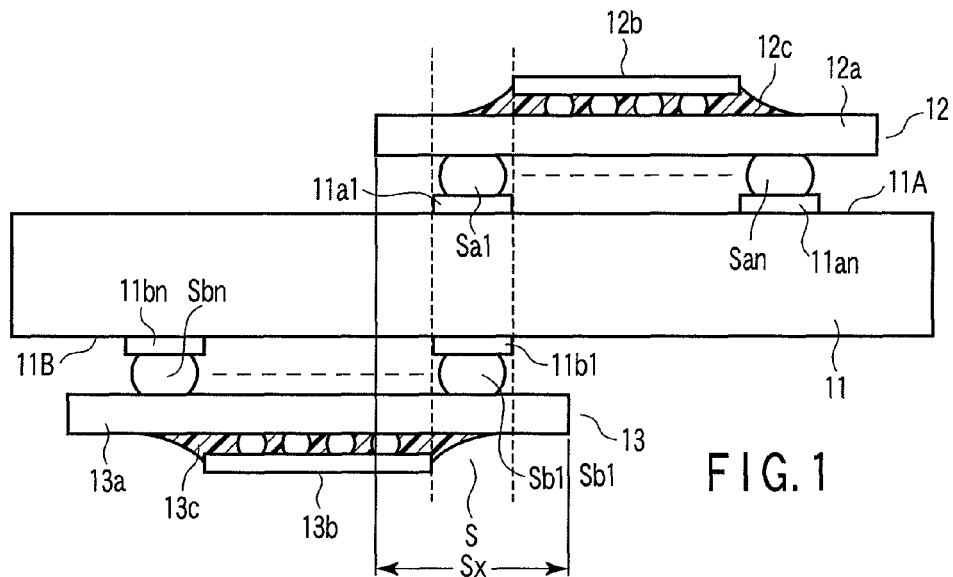
FIG. 1 is a side view showing a principal part of a printed wiring board structure according to a first embodiment of the present invention.

Various embodiments according to the present invention will be hereinafter described with reference to the accompanying drawings. In general, according to one embodiment of the invention, there is provided a printed wiring board structure comprising:

a printed wiring board having first and second component mounting surfaces at front and back sides thereof, respectively, each for mounting a semiconductor package loading a semiconductor chip loaded on a substrate as a mounting component;

a first semiconductor package mounted on the first component mounting surface; and a second semiconductor package mounted on the second component mounting surface, wherein the first and second semiconductor packages have a positional relationship such that the substrates are partially overlapped via the printed wiring board, and the semiconductor chips are not overlapped.

According to the printed wiring board structure of the present invention, the following positional relationship is established in a semiconductor package mounting structure. Specifically, substrates are partially overlapped with each other in both component mounting surfaces of a printed wiring board. On the contrary, semiconductor chips are not overlapped with each other therein. Based on the foregoing positional relationship, the semiconductor package is mountable on the front and back component mounting surfaces. In other words, if semiconductor chips (bare chips) are mutually overlapped (of course, substrates are also mutually overlapped), this is a factor of reducing connection reliability. In order to solve the foregoing problem, according to the present invention, the semiconductor package is mountable on the front and back component mounting surfaces in a range where semiconductor chips are not mutually overlapped. In this way, high density of mounting components and wirings is achieved without reducing the connection reliability.

As described above, in the circuit board mounted with a large-sized semiconductor package such as BGA and LGA, stress is concentrated on the corner portion of a flat and rectangular package due to stress and strain by thermal and mechanical stress. This is a factor of the circuit break-down at the solder joint portion; as a result, connection reliability is reduced.

In particular, the foregoing problem is serious in a printed wiring board structure using the front and back sides of a printed wiring board as component mounting surfaces. Specifically, semiconductor packages such as BGA are mounted on the front and back sides of the printed wiring board in a state of being overlapped. When these semiconductor packages are fixed on the printed wiring board, stress concentrates at the under part of the bare chip. Thus, when actual products are used, an influence of stress by temperature change is easy to receive; as a result, connection reliability is remarkably reduced. This is confirmed from the temperature cycle test result and the stress structure analysis result using a finite element method.

According to the printed wiring board structure of the present invention, the following advantage is obtained. Namely, the foregoing component arrangement structure (positional relationship) is provided, and thereby, the circuit break-down at the solder joint portion by the stress is prevented as much as possible. In this way, high density of components and wirings is realized without reducing the connection reliability.

Various embodiments of the present invention will be hereinafter described with reference to the accompanying drawings.

Figure 2:
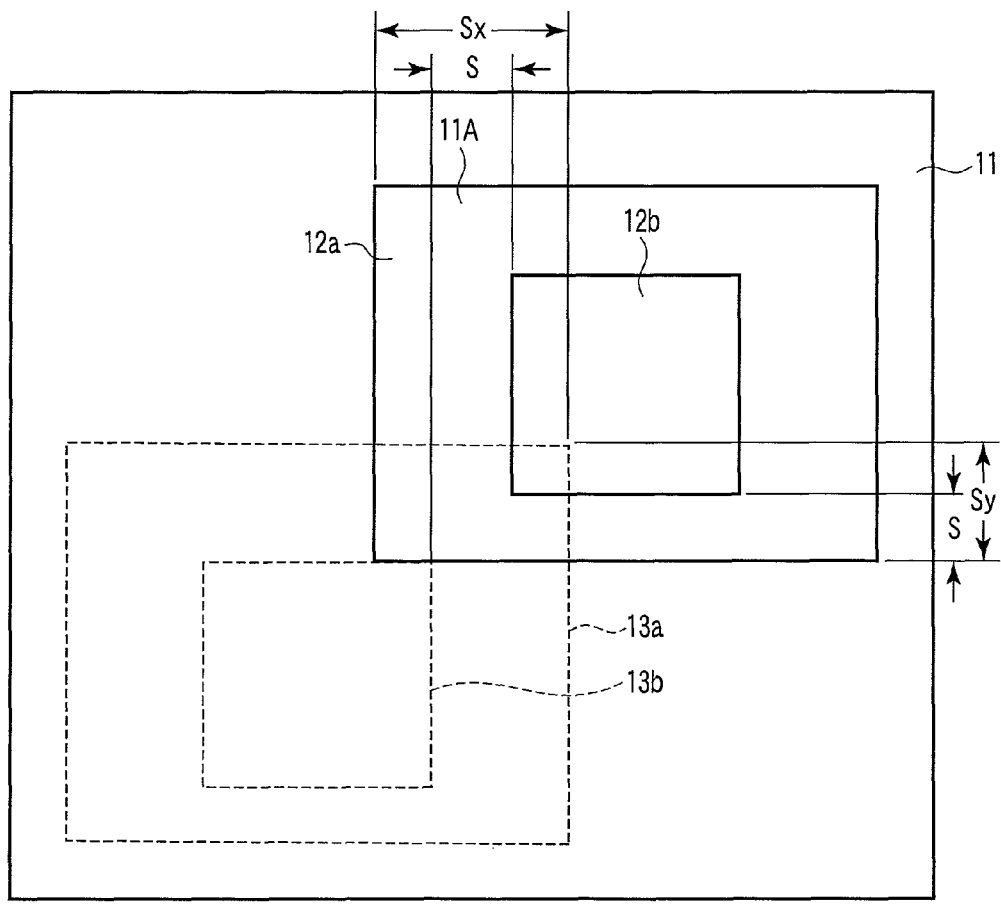
FIG. 2 is a plan view showing the principal part of the printed wiring board structure according to the first embodiment.

FIG. 1 and FIG. 2 show a printed wiring board structure according to a first embodiment of the present invention. FIG. 1 is a side view showing principal parts, and FIG. 2 is a plan view showing a principal part.

As shown in FIG. 1 and FIG. 2, the printed wiring board structure according to the first embodiment of the present invention includes a printed wiring board 11 and first and second semiconductor packages 12 and 13. The printed wiring board 11 has the front and back sides, that is, first and second component mounting surfaces 11A and 11B, which are mounted with semiconductor packages loading semiconductor chips on substrates as mounting components, respectively. Further, the following positional relationship S is established. According to the positional relationship S, substrates 12a and 13a are partially overlapped via the printed wiring board 11, and semiconductor chips 12b and 13b are not overlapped. The first semiconductor package 12 is mounted on the foregoing first component mounting surface 11A. The second semiconductor package 13 is mounted on the foregoing second component mounting surface 11B.

According to this embodiment, the first and second semiconductor packages 12 and 13 mounted on the first and second component mounting surfaces 11A and 11b are each a large-sized (e.g., 40-millimeter square) ball grid array (BGA).

The first component mounting surface 11A of the printed wiring board 11 is provided with many component joint electrodes $11a, \ldots 11an$, which are used to mount the first semiconductor package 12 as a mounting component.

Solder balls Sa1 to San of the first semiconductor package 12 are soldered to the component joint electrodes $11a, \ldots 11an$, respectively, and thereby, the first semiconductor package 12 is mounted on the first component mounting surface 11A of the printed wiring board 11.

The second component mounting surface 11B of the printed wiring board 11 is provided with many component joint electrodes $11b, \ldots 11bn$, which are used to mount the second semiconductor package 13 as a mounting component.

Solder balls Sb1 to Sbn of the second semiconductor package 13 are soldered to the component joint electrodes $11b, \ldots 11bn$, respectively, and thereby, the second semiconductor package 13 is mounted on the second component mounting surface 11B of the printed wiring board 11.

As seen from FIG. 1 and FIG. 2, the printed wiring board 11 according to the first embodiment of the present invention has the positional relationship with respect to a non-overlap distance S in the lateral and vertical directions in the front and back sides via the board 11, that is, component mounting surfaces 11A and 11B of the printed wiring board 11. Specifically, the substrates 12a and 13a are partially overlapped by Sx in the lateral direction and by Sy in the vertical direction as shown in FIG. 2, and the semiconductor chips 12b and 13b are not overlapped or separated by S in the lateral and vertical directions. Based on the non-overlap positional relationship S of the chips 12b and 13b, the first semiconductor package 12 is mounted on the first component mounting surface 11A, and the second semiconductor package 13 is mounted on the second component mounting surface 11B. In other words, according to this embodiment, the semiconductor chip 12b loaded on the substrate 12a of the first semiconductor package 12 is not overlapped with the semiconductor chip 13b loaded on the substrate 13a of the second semiconductor package 13 and separated by S in the lateral and vertical directions. Based on the foregoing range, positional overlapping of the first and second semiconductor packages 12 and 13 by Sx and Sy in the lateral and vertical directions is allowable on the front and back side mounting surfaces. In this case, a range that semiconductor chips 12b and 13b are not overlapped is set including each bonding area of under fills 12c and 13c filled between the substrate 12a and the semiconductor chip 12b and between the substrate 13a and the semiconductor chip 13b. For example, in a case of a bare chip mounting structure where no projection of under fills 12c and 13c to the side area of the chips 12b and 13b is formed, the foregoing positional relationship S may be further narrowed (S=0 in both lateral and vertical directions); therefore, the component mounting density is further improved.

According to the foregoing first embodiment, the following component mounting structure is provided. Specifically, positional overlapping of the first and second semiconductor packages 12 and 13 is allowable on the front and back mounting surfaces in the following range. According to the range, the semiconductor chip 12b loaded on the substrate 12a of the first semiconductor package 12 and the semiconductor chip 13b loaded on the substrate 13a of the second semiconductor package 12 are separated by S so that the chips 12b and 13b are not mutually overlapped. Therefore, high density of components and wirings is achieved without reducing connection reliability. In addition, the printed wiring board structure according to this embodiment of the present invention has the following advantages. Specifically, specific structure and auxiliary members are not used at all to prevent the connection reliability from being reduced caused by overlapping of semiconductor packages mounted on the front and back surfaces of the printed wiring board. This component arrangement structure is excellent in economy and in practical use. Therefore, high density of components and wirings may be achieved without reducing connection reliability.

Figure 3:
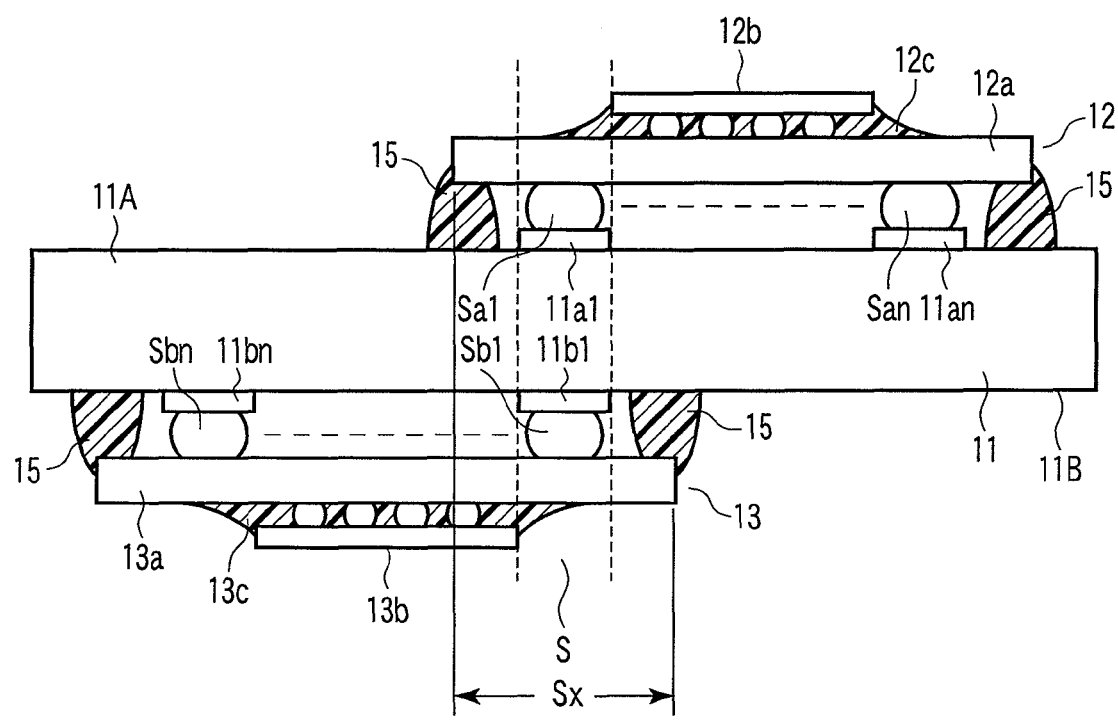
FIG. 3 is a side view showing a principal part of a printed wiring board structure according to a second embodiment of the present invention.

FIG. 3 is a side view showing a printed wiring board structure according to a second embodiment of the present invention.

As shown in FIG. 3, the printed wiring board structure according to a second embodiment of the present invention includes a printed wiring board 11, first and second semiconductor packages 12, 13, and reinforcement members 15. The printed wiring board 11 has the front and back sides, that is, first and second component mounting surfaces 11A and 11B, which are mounted with the semiconductor packages 12, 13 loading semiconductor chips 12b, 13b on the substrates 12a, 13a as mounting components.

Further, the following positional relationship is established. According to the positional relationship, substrates 12a and 13a are partially overlapped by Sx in the lateral direction via the printed wiring board 11, and semiconductor chips 12b and 13b are not overlapped so that the chips 12b and 13b are separated by S in the lateral direction.

The first semiconductor package 12 is mounted on the foregoing first component mounting surface 11A. The second semiconductor package 13 is mounted on the foregoing second component mounting surface 11B. The reinforcement members 15 are formed by bonding between the following two portions on the packages 12 and 13, respectively, using a bonding agent (resin material). Namely, four reinforcement members 15 are bonded between each of the four corner portions (see FIG. 2) of the substrate 12a of the first semiconductor package 12, for example, and the first component mounting surface 11A. Further, four reinforcement members 15 are bonded between each of the four corner portions (see FIG. 2) of the substrate 13a of the first semiconductor package 13 and the second component mounting surface 11B.

The corresponding portions of FIG. 3 embodiment are designated by the same reference characters as those of FIG. 1 and the structure and the function of these portions are same so that further descriptions thereof are omitted here.

According to the foregoing second embodiment, the following component mounting structure is provided.

Specifically, positional overlapping of the first and second semiconductor packages 12 and 13 is allowable on the front and back mounting surfaces in the following range. According to the range, the semiconductor chip 12b loaded on the substrate 12a of the first semiconductor package 12 and the semiconductor chip 13b loaded on the substrate 13a of the second semiconductor package 12 are not mutually overlapped in the similar manner as FIG. 1 embodiment. Therefore, high density of components and wirings is achieved without reducing connection reliability.

Further, the printed wiring board structure according to this embodiment of the present invention has the following advantages. Specifically, specific structure and auxiliary members are not used at all to prevent the connection reliability from being reduced by overlapping of semiconductor packages mounted on the front and back surfaces of the printed wiring board. This component arrangement structure is excellent in economy and in practical use. Therefore, high density of components and wirings is achieved without reducing connection reliability.

Furthermore, according to the second embodiment, joint strength of the solder joint portion is reinforced using the foregoing reinforcement members 15 in each corner portion of the substrates 12a and 13a of the first and second semiconductor packages 12 and 13, respectively. Therefore, high density of components and wirings is achieved without reducing connection reliability. In addition to this advantage, it is possible to provide a printed wiring board, which has high reliability and is excellent in impact (shock) resistance.

Figure 4:
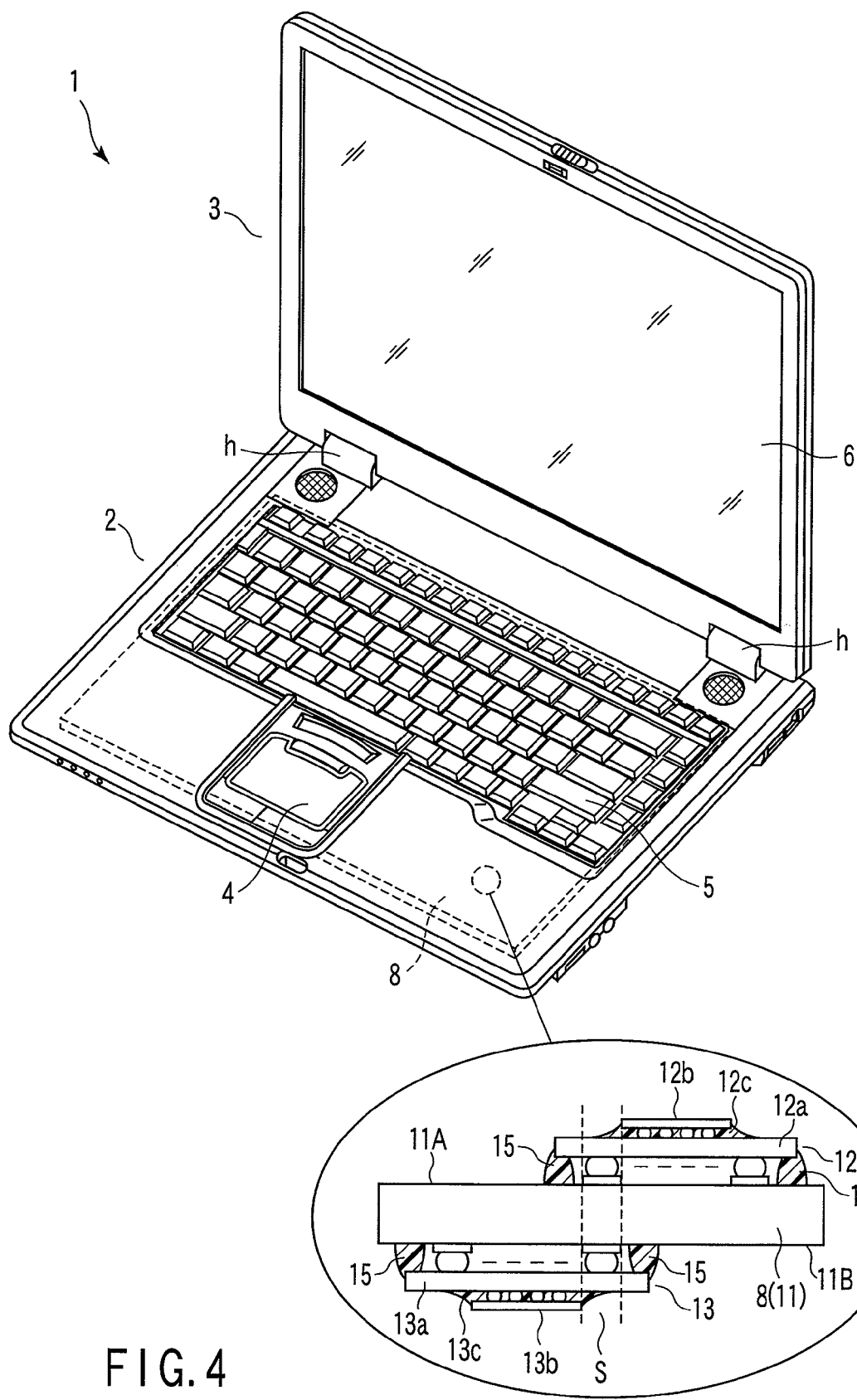
FIG. 4 is a perspective view showing an electronic apparatus according to a third embodiment of the present invention.

FIG. 4 shows a third embodiment of the present invention.

The third embodiment relates to an electronic apparatus using a circuit board having the printed wiring board structure shown in the foregoing second embodiment. FIG. 4 shows an example of applying the printed wiring board structure according to the second embodiment to a small-sized electronic apparatus such as a handy-type portable computer.

As illustrate in FIG. 4, a main body 2 of a portable computer 1 is attached with a display housing 3, which is freely rotatable via hinge mechanisms h. The main body 2 is provided with a pointing device 4, an operation part such as a keyboard 5, etc. The display housing 3 is provided with a display device 6 such as LCD, for example.

The main body 2 has a built-in circuit board or a mother board 8. A control circuit for controlling the foregoing pointing device 4, operation part such as keyboard 5 and display device 6 is incorporated into the circuit board 8. The circuit board 8 is realized using the printed wiring board 11 of the second embodiment shown in FIG. 3.

As shown in FIG. 4, the circuit board 8 using the printed wiring board 11 of the second embodiment includes a printed wiring board 11, first and second semiconductor packages 12, 13, and reinforcement members 15. The printed wiring board 11 has the front and back sides, that is, first and second component mounting surfaces 11A and 11B, which are mounted with a semiconductor packages 12, 13 loading semiconductor chips (bare chips) on substrates 12a, 13a as mounting components. Further, the following positional relationship is established. According to the positional relationship, substrates 12a and 13a are partially overlapped by Sx (as shown in FIG. 3) via the printed wiring board 11, and semiconductor chips 12b and 13b are not overlapped separated with a distance S as shown in FIG. 3. The first semiconductor package 12 is mounted on the foregoing first component mounting surface 11A. The second semiconductor package 13 is mounted on the foregoing second component mounting surface 11B. The reinforcement members 15 are formed for bonding the following two portions using a bonding agent (resin material). Namely, the reinforcement members 15 are bonded between each corner portion (see FIG. 2) of the substrate 12a of the first semiconductor package 12 and the first component mounting surface 11A. Further, the reinforcement members 15 are bonded between each corner portion (see FIG. 2) of the substrate 13a of the first semiconductor package 13 and the second component mounting surface 11B.

As described above, joint strength of the solder joint portion is reinforced using the foregoing reinforcement members 15 in each of four corner portions of the substrates 12a and 13a of the first and second semiconductor package 12 and 13, respectively. Therefore, the foregoing reinforced structure is provided, and thereby, high density of components and wirings is achieved without reducing connection reliability. In addition to this advantage, it is possible to realize a circuit board, which has high reliability and is excellent in impact or shock resistance. Therefore, this serves to provide a small-sized electronic apparatus having high reliability.

According to the foregoing embodiments, the semiconductor packages 12 and 13 mounted on the component mounting surfaces 11A and 11B are each of a ball grid array (BGA) structure. For example, BGA and land grid array (LGA) structures may be combined, or BGA and chip size package (CSP) structures may be combined.

Overlapping of the substrates 12a and 13a and non-overlapping of semiconductor chips 12b and 13b are not limited to illustration shown in the embodiments.

While certain embodiments of the invention have been described, there embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A printed wiring board structure comprising:
    a printed wiring board having first and second component mounting surfaces at front and back sides thereof, respectively, to mount first and second semiconductor packages loading first and second semiconductor chips as mounting components,
    wherein the first semiconductor package is mounted on the first component mounting surface, the first semiconductor package comprising the first semiconductor chip,
    wherein the second semiconductor package is mounted on the second component mounting surface, the second semiconductor package comprising the second semiconductor chip, and
    wherein the first and second semiconductor packages have a positional relationship such that at least a portion of an edge of the first semiconductor chip borders at least a portion of an edge of the second semiconductor chip via the printed wiring board, but that the first and second semiconductor chips are not overlapped.

2. The structure of claim 1, wherein the first semiconductor package is soldered with a first solder ball array on the first component mounting surface, and the second semiconductor package is soldered with a second solder ball array on the second component mounting surface.

3. The structure of claim 1, the first and second semiconductor chips are mounted on first and second substrates, respectively, wherein each of the first and second substrates has a flat rectangular shape, and wherein there are first gluing areas between each corner portion of the substrate of the first semiconductor package and the first component mounting surface, and there are second gluing areas between each corner portion of the substrate of the second semiconductor package and the second component mounting surface, that are made using adhesive material.

4. An electronic apparatus comprising:
    an electronic apparatus body; and
    a circuit board structure built in the electronic apparatus body, the circuit board structure comprising,
        a printed wiring board having first and second component mounting surfaces at front and back sides thereof, respectively, for mounting first and second semiconductor packages loading first and second semiconductor chips as mounting components,
        wherein the first semiconductor package is mounted on the first component mounting surface, the first semiconductor package comprising the first semiconductor chip,
        wherein the second semiconductor package is mounted on the second component mounting surface, the second semiconductor package comprising the second semiconductor chip,
        wherein the first and second semiconductor packages have a positional relationship such that at least a portion of an edge of the first semiconductor chip borders at least a portion of an edge of the second semiconductor chip via the printed wiring board, but that the first and second semiconductor chips are not overlapped.

* * * * *